(12) United States Patent
Ohchi

(10) Patent No.: US 10,381,424 B2
(45) Date of Patent: Aug. 13, 2019

(54) DISPLAY DEVICE AND METHOD FOR MANUFACTURING THE SAME

(71) Applicant: Sony Corporation, Tokyo (JP)

(72) Inventor: Tomokazu Ohchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/761,170

(22) PCT Filed: Aug. 5, 2016

(86) PCT No.: PCT/JP2016/073096
§ 371 (c)(1),
(2) Date: Mar. 19, 2018

(87) PCT Pub. No.: WO2017/051622
PCT Pub. Date: Mar. 30, 2017

(65) Prior Publication Data
US 2018/0269267 A1    Sep. 20, 2018

(30) Foreign Application Priority Data
Sep. 25, 2015    (JP) .................................. 2015-187573

(51) Int. Cl.
| | |
|---|---|
| *H01L 27/32* | (2006.01) |
| *G09F 9/30* | (2006.01) |
| *H05B 33/24* | (2006.01) |
| *H01L 51/52* | (2006.01) |
| *H01L 51/56* | (2006.01) |
| *H05B 33/14* | (2006.01) |

(52) U.S. Cl.
CPC ............ *H01L 27/3246* (2013.01); *G09F 9/30* (2013.01); *H01L 27/32* (2013.01);
(Continued)

(58) Field of Classification Search
CPC ............. H01L 27/3246; H01L 51/5271; H01L 27/3272; H01L 27/3211; H01L 51/56;
(Continued)

(56) References Cited

U.S. PATENT DOCUMENTS

| | | | |
|---|---|---|---|
| 2004/0169468 A1* | 9/2004 | Peng | ................... H01L 27/3283 313/512 |
| 2012/0223342 A1* | 9/2012 | Tanada | ................ H01L 27/3204 257/88 |

(Continued)

FOREIGN PATENT DOCUMENTS

| | | |
|---|---|---|
| JP | 2002-252087 A | 9/2002 |
| JP | 2007-108248 A | 4/2007 |

(Continued)

*Primary Examiner* — Karen Kusumakar
*Assistant Examiner* — Adam S Bowen
(74) *Attorney, Agent, or Firm* — Michael Best & Friedrich LLP

(57) ABSTRACT

A display device includes a plurality of pixels each including a first light emitting element with a first light reflecting layer, a second light emitting element with a second light reflecting layer, and a third light emitting element with a third light reflecting layer, arranged in a two-dimensional matrix. Each of the light emitting elements includes a first electrode, an organic layer, and a second electrode. Grooves that each have a light shielding layer are formed in a boundary region between the light emitting elements. A bottom of the first groove and a bottom of the third groove are located at a position higher than a top surface of the first light reflecting layer. A bottom of the second groove is located at a position higher than a top surface of the second light reflecting layer.

6 Claims, 8 Drawing Sheets

(52) U.S. Cl.
CPC ...... *H01L 27/3211* (2013.01); *H01L 27/3272* (2013.01); *H01L 51/5271* (2013.01); *H01L 51/56* (2013.01); *H05B 33/145* (2013.01); *H05B 33/24* (2013.01)

(58) Field of Classification Search
CPC ....... H01L 27/32; H05B 33/145; H05B 33/24; G09F 9/30
USPC .......................................................... 257/40
See application file for complete search history.

(56) References Cited

U.S. PATENT DOCUMENTS

| | | | | |
|---|---|---|---|---|
| 2014/0332778 | A1* | 11/2014 | Ito | H01L 27/3258 257/40 |
| 2014/0367660 | A1* | 12/2014 | Fukuda | H01L 51/5265 257/40 |
| 2015/0069362 | A1* | 3/2015 | Ito | H01L 27/323 257/40 |
| 2015/0097168 | A1* | 4/2015 | Hanawa | H01L 51/5271 257/40 |
| 2015/0236295 | A1* | 8/2015 | Lim | H01L 51/5218 257/40 |
| 2015/0357388 | A1* | 12/2015 | Pang | H01L 27/3223 257/40 |
| 2017/0179211 | A1* | 6/2017 | Kanaya | H01L 27/3246 |
| 2018/0210306 | A1* | 7/2018 | Okabe | G02F 1/1333 |

FOREIGN PATENT DOCUMENTS

| | | |
|---|---|---|
| JP | 2009-091223 A | 4/2009 |
| JP | 2015-062194 A | 4/2015 |
| WO | 2013/047621 A1 | 4/2013 |
| WO | 2015/114942 A1 | 8/2015 |

* cited by examiner

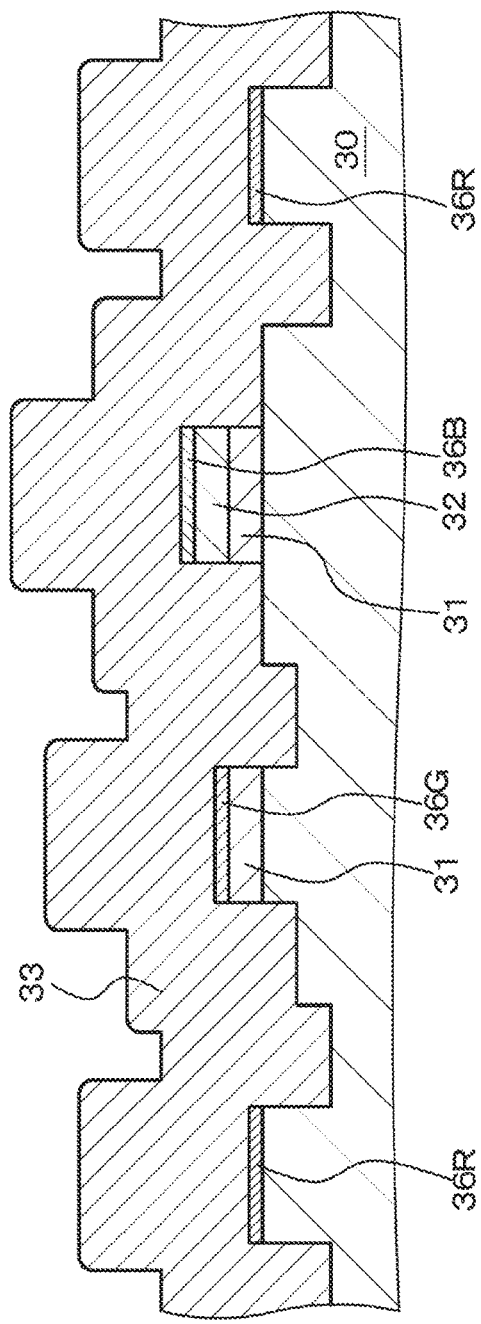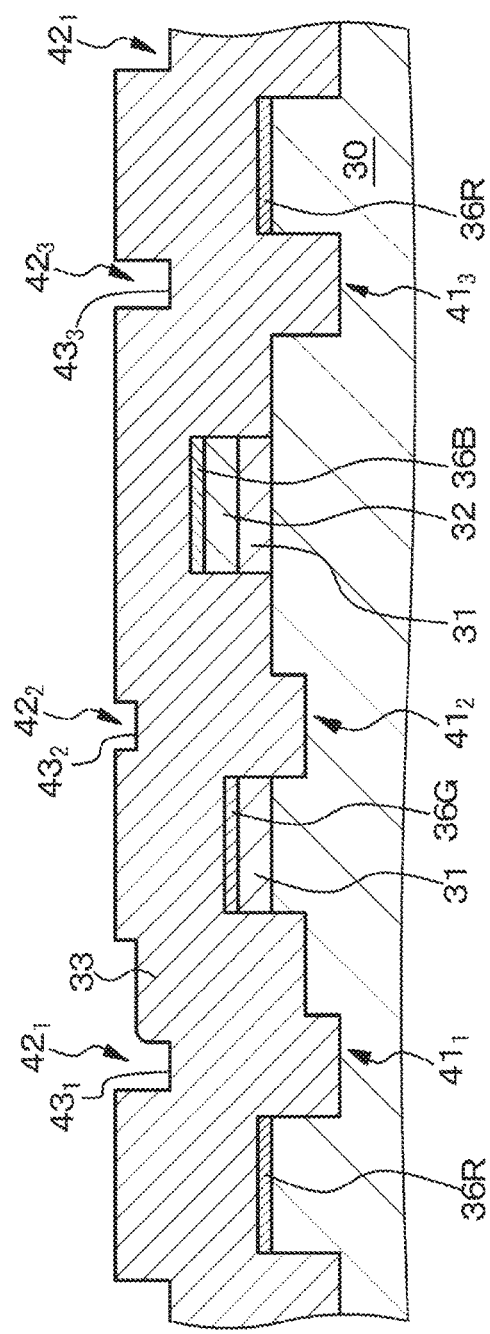

DISPLAY DEVICE AND METHOD FOR MANUFACTURING THE SAME

TECHNICAL FIELD

The present disclosure relates to a display device and a method for manufacturing the display device.

BACKGROUND ART

In recent years, as a display device substituted for a liquid crystal display device, an organic electroluminescence display device (hereinafter, also simply abbreviated as an "organic EL display device") using an organic electroluminescence element (hereinafter, also simply abbreviated as an "organic EL element") has attracted attention. The organic EL display device is a self-luminous type, has a characteristic of low power consumption, and is considered to have sufficient responsiveness even to a high-definition high-speed video signal. Development and commercialization of the organic EL display device for practical use are keenly proceeding.

In the organic EL display device, high contrast and high color reproducibility can be realized, for example, by constituting one pixel with three sub-pixels (light emitting elements) constituted by a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light. Meanwhile, reduction of a pixel pitch is required for high resolution. However, it becomes more difficult to constitute one pixel with such three sub-pixels as the pixel pitch becomes finer.

Therefore, development of a method for forming a white light emitting layer over all pixels and coloring white light using a color filter, that is, development of technology for constituting one pixel with three kinds of sub-pixels (light emitting elements) of a red sub-pixel (referred to as a "red light emitting element") obtained by combining a light emitting element having a white light emitting layer (referred to as a "white light emitting element") and a red color filter, a green sub-pixel (referred to as a "green light emitting element") obtained by combining a white light emitting element and a green color filter, and a blue sub-pixel (referred to as a "blue light emitting element") obtained by combining a white light emitting element and a blue color filter is proceeding. The white light emitting layer is formed as a continuous layer over the entire white light emitting element. It is unnecessary to form the red light emitting layer, the green light emitting layer, and the blue light emitting layer for each sub-pixel. Therefore, the pixel pitch can be fine. In each of the white light emitting elements, the white light emitting layer is formed between a first electrode and a second electrode. The first electrode is formed independently in each of the light emitting elements. Meanwhile, the second electrode is common in each of the light emitting elements.

As technology for improving a light extraction efficiency in a pixel having such a configuration, there is technology for amplifying light emitted from each of light emitting elements by optimizing a cavity structure in each of the red light emitting element, the green light emitting element, and the blue light emitting element. Specifically, for example, as disclosed in Japanese Patent Application Laid-Open No. 2009-091223, a light reflecting layer is formed below a first electrode including a transparent electrode, and a second electrode including a semi-light transmitting material and the light reflecting layer constitute a resonator structure. In addition, light emitted from a light emitting layer is resonated between the light reflecting layer and the second electrode, and a part of the light is emitted from the second electrode.

CITATION LIST

Patent Document

Patent Document 1: Japanese Patent Application Laid-Open No. 2009-091223

SUMMARY OF THE INVENTION

Problems to be Solved by the Invention

By the way, light emitted from a light emitting layer is propagated in all directions. Therefore, as illustrated in a schematic partial cross-sectional view of FIG. 8, light emitted from a certain light emitting element (indicated by a thick solid line in FIG. 8) may enter a light emitting element adjacent to the certain light emitting element (referred to as an "adjacent light emitting element" for convenience). Alternatively, multiple reflection occurs inside a display device, and light emitted from a certain light emitting element may enter an adjacent light emitting element. Note that refer to FIG. 1 for reference numerals in FIG. 8. As a result, chromaticity of the entire pixels may be shifted from desired chromaticity.

Therefore, an object of the present disclosure is to provide a display device including a light emitting element having a configuration and a structure hardly causing entry of light into an adjacent light emitting element, and a method for manufacturing the display device.

Solutions to Problems

In order to achieve the above object, a method for manufacturing a display device according to the present disclosure is a method for manufacturing a display device including a plurality of pixels each including a first light emitting element, a second light emitting element, and a third light emitting element, arranged in a two-dimensional matrix, each of the pixels including a lowermost layer/interlayer insulation layer, a first interlayer insulation layer formed on the lowermost layer/interlayer insulation layer, a second interlayer insulation layer formed on the first interlayer insulation layer, and an uppermost layer/interlayer insulation layer, each of the light emitting elements including:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode and including a light emitting layer containing an organic light emitting material; and a second electrode formed on the organic layer, the first light emitting element including a first light reflecting layer formed on the lowermost layer/interlayer insulation layer, the second light emitting element including a second light reflecting layer formed on the first interlayer insulation layer, and the third light emitting element including a third light reflecting layer formed on the second interlayer insulation layer, the method including:

(A) forming a lowermost layer/interlayer insulation layer, a patterned first interlayer insulation layer, and a patterned second interlayer insulation layer; then (B) forming a light reflecting layer on the entire surface and then patterning the light reflecting layer to form a first light reflecting layer on a region of the lowermost layer/interlayer insulation layer where a first light emitting element is to be formed, to form a second light reflecting layer on a region of the first interlayer insulation layer where a second light emitting element is to be formed, and to form a third light reflecting layer on a region of the second interlayer insulation layer where a third light emitting element is to be formed; then (C) etching at least a portion of the first interlayer insulation layer located in a boundary region between the first light emitting element and the second light emitting element to form a first recess, at the same time etching at least a portion of the second interlayer insulation layer located in a boundary region between the second light emitting element and the third light emitting element to form a second recess, and at the same time etching at least a portion of the first interlayer insulation layer and a portion of the second interlayer insulation layer located in a boundary region between the first light emitting element and the third light emitting element to form a third recess; then (D) forming an uppermost layer/interlayer insulation layer on the entire surface and then flattening the uppermost layer/interlayer insulation layer to form a first groove, a second groove, and a third groove in a portion of the uppermost layer/interlayer insulation layer above the first recess, the second recess, and the third recess, respectively; and then (E) forming a light shielding layer inside the first groove, the second groove, and the third groove.

In order to achieve the above object, a display device of the present disclosure includes a plurality of pixels each including a first light emitting element, a second light emitting element, and a third light emitting element, arranged in a two-dimensional matrix.

Each of the pixels includes a lowermost layer/interlayer insulation layer, a first interlayer insulation layer formed on the lowermost layer/interlayer insulation layer, a second interlayer insulation layer-formed on the first interlayer insulation layer, and an uppermost layer/interlayer insulation layer.

Each of the light emitting elements includes:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode and including a light emitting layer containing an organic light emitting material; and a second electrode formed on the organic layer.

The first light emitting element includes a first light reflecting layer formed on the lowermost layer/interlayer insulation layer.

The second light emitting element includes a second light reflecting layer formed on the first interlayer insulation layer.

The third light emitting element includes a third light reflecting layer formed on the second interlayer insulation layer.

The uppermost layer/interlayer insulation layer covers the lowermost layer/interlayer insulation layer, the first light reflecting layer, the second light reflecting layer, and the third light reflecting layer.

A first groove is formed in a portion of the uppermost layer/interlayer insulation layer located in a boundary region between the first light emitting element and the second light emitting element.

A second groove is formed in a portion of the uppermost layer/interlayer insulation layer located in a boundary region between the second light emitting element and the third light emitting element.

A third groove is formed in a portion of the uppermost layer/interlayer insulation layer located in a boundary region between the first light emitting element and the third light emitting element.

A light shielding layer is formed inside the first groove, the second groove, and the third groove.

A lowermost portion of a bottom of the first groove and a lowermost portion of a bottom of the third groove are located at a position higher than a top surface of the first light reflecting layer.

A lowermost portion of a bottom of the second groove is located at a position higher than a top surface of the second light reflecting layer.

Effects of the Invention

In the method for manufacturing a display device according to the present disclosure, in step (E), a light shielding layer is formed inside the first groove, the second groove, and the third groove. In addition, in the display device of the present disclosure, a light shielding layer is formed inside the first groove, the second groove, and the third groove. Therefore, it is possible to manufacture a display device hardly causing entry of light into an adjacent light emitting element. Furthermore, in step (D), an uppermost layer/interlayer insulation layer is formed on the entire surface, and then the uppermost layer/interlayer insulation layer is flattened. The first groove, the second groove, and the third groove can be thereby formed by a so-called self-alignment method. Therefore, a light emitting element can be micronized. In addition, in the display device of the present disclosure, a relationship between a lowermost portion of a bottom of a groove and the height of a top surface of a light reflecting layer is defined. Therefore, it is possible to reliably prevent contact between the groove and the light reflecting layer. Contact between the groove and the light reflecting layer changes capacitance of a light emitting element. As a result, variation in luminescent color and brightness may occur. Note that effects described herein are merely illustrative and are not restrictive. In addition, an additional effect may be present.

BRIEF DESCRIPTION OF DRAWINGS

FIGS. 5A and 5B are schematic partial end views of a lowermost layer/interlayer insulation layer and the like for describing the method for manufacturing the display device of Example 1, following FIG. 4B.

MODE FOR CARRYING OUT THE INVENTION

Figure 1:
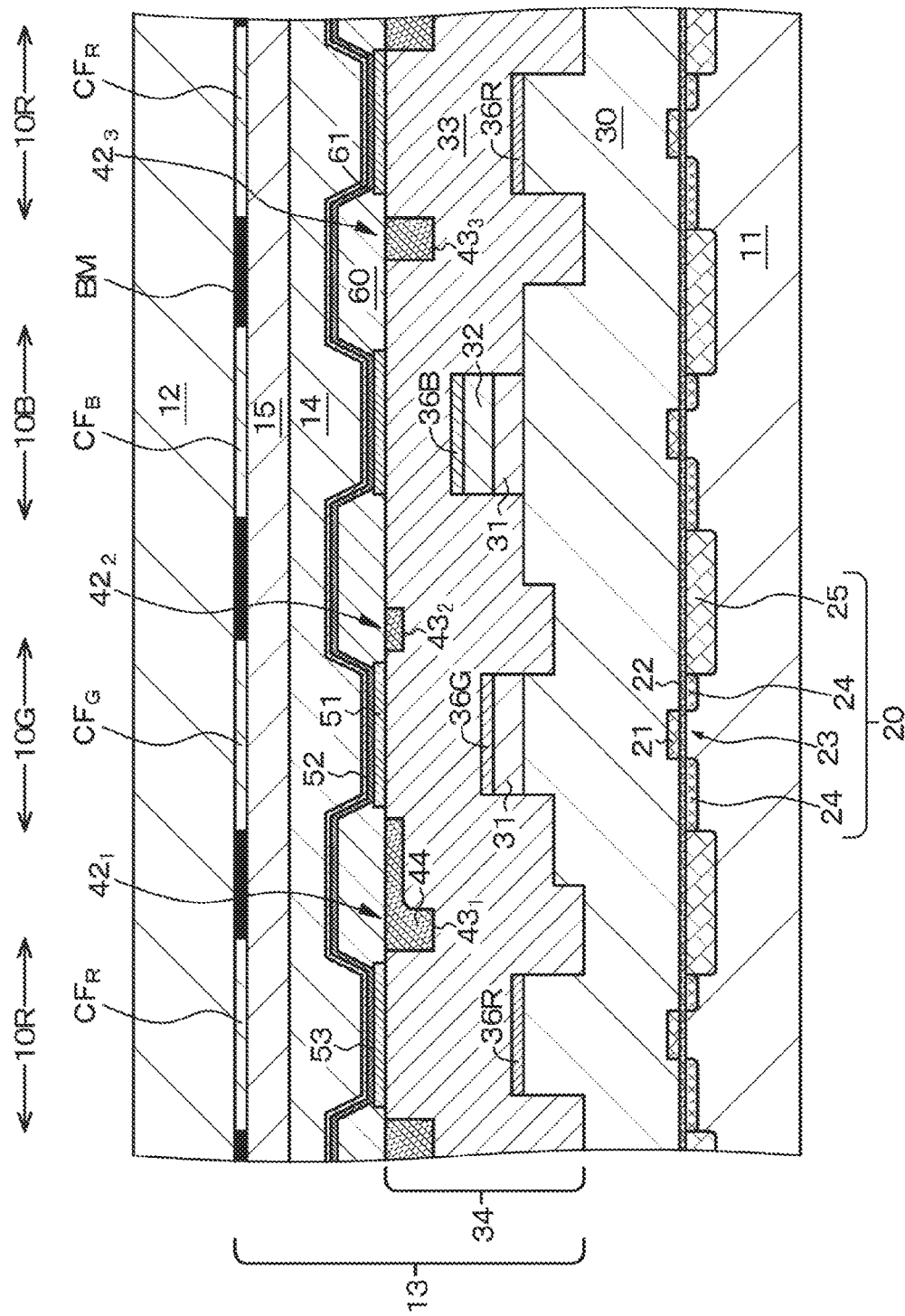
FIG. 1 is a schematic partial cross-sectional view of a display device of Example 1.
Figure 2A:
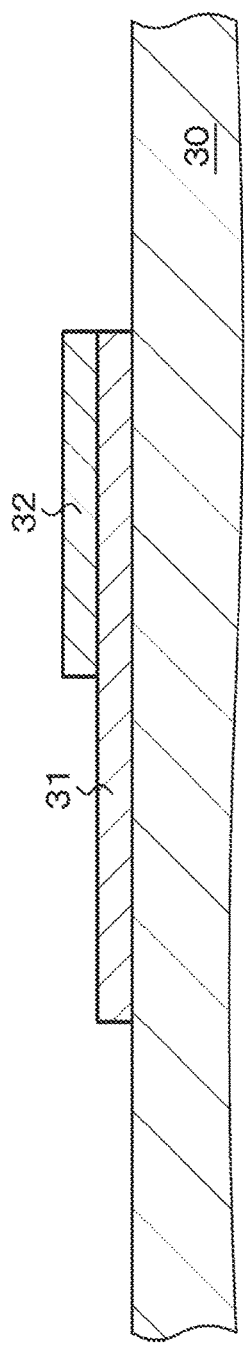
FIGS. 2A, 2B, and 2C are schematic partial end views of a lowermost layer/interlayer insulation layer and the like for describing a method for manufacturing the display device of Example 1.
Figure 2B:
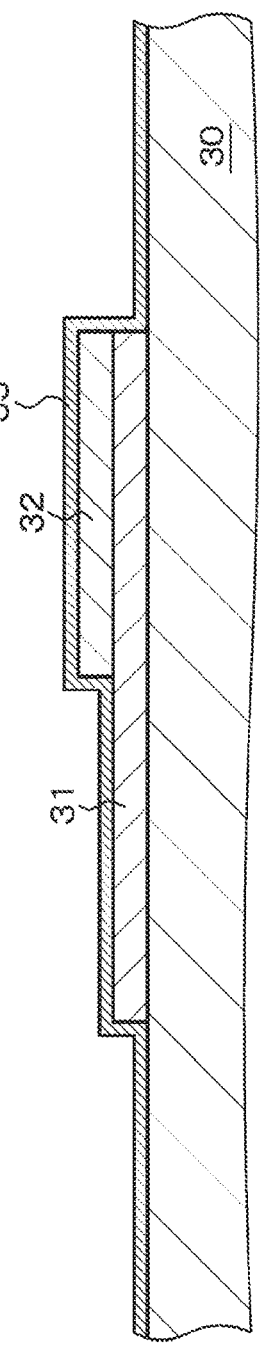
Figure 2C:
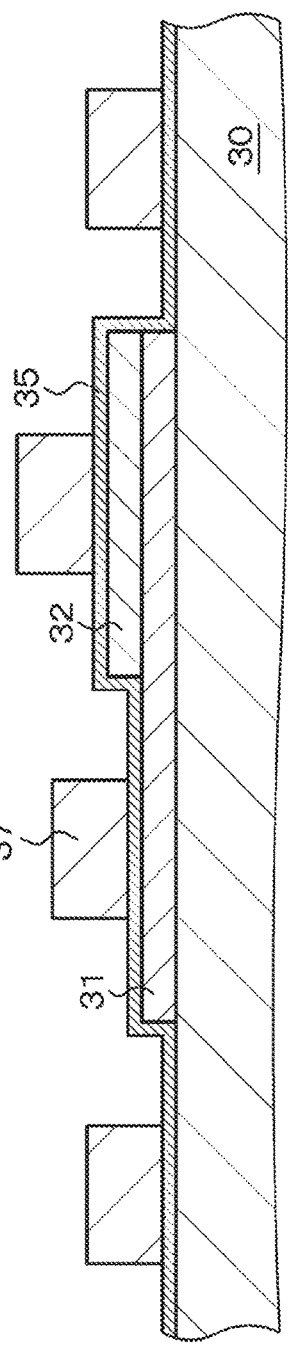
Figure 3A:
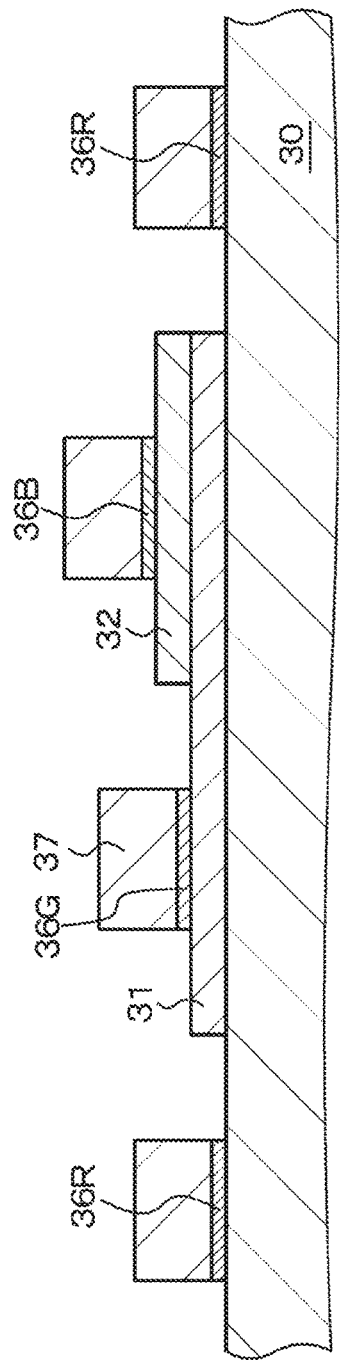
FIGS. 3A and 3B are schematic partial end views of a lowermost layer/interlayer insulation layer and the like for describing the method for manufacturing the display device of Example 1, following FIG. 2C.
Figure 3B:
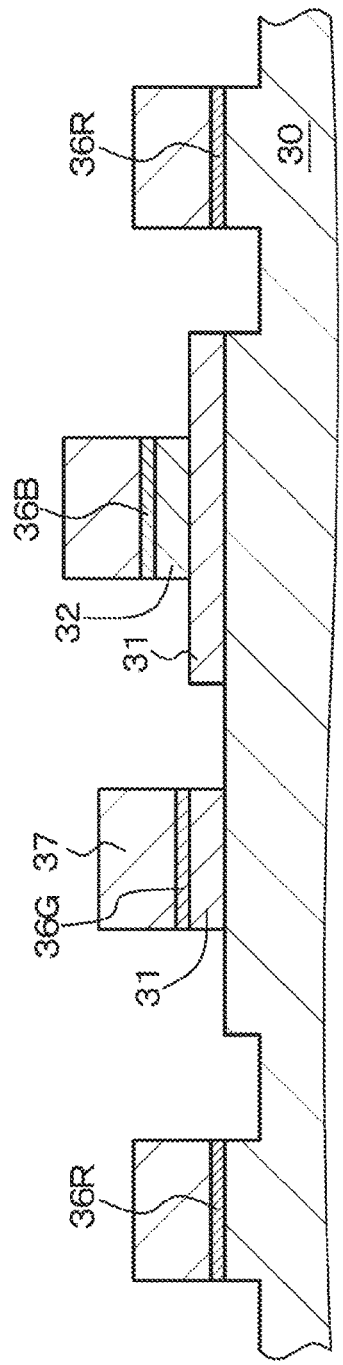
Figures 4A, 4B:
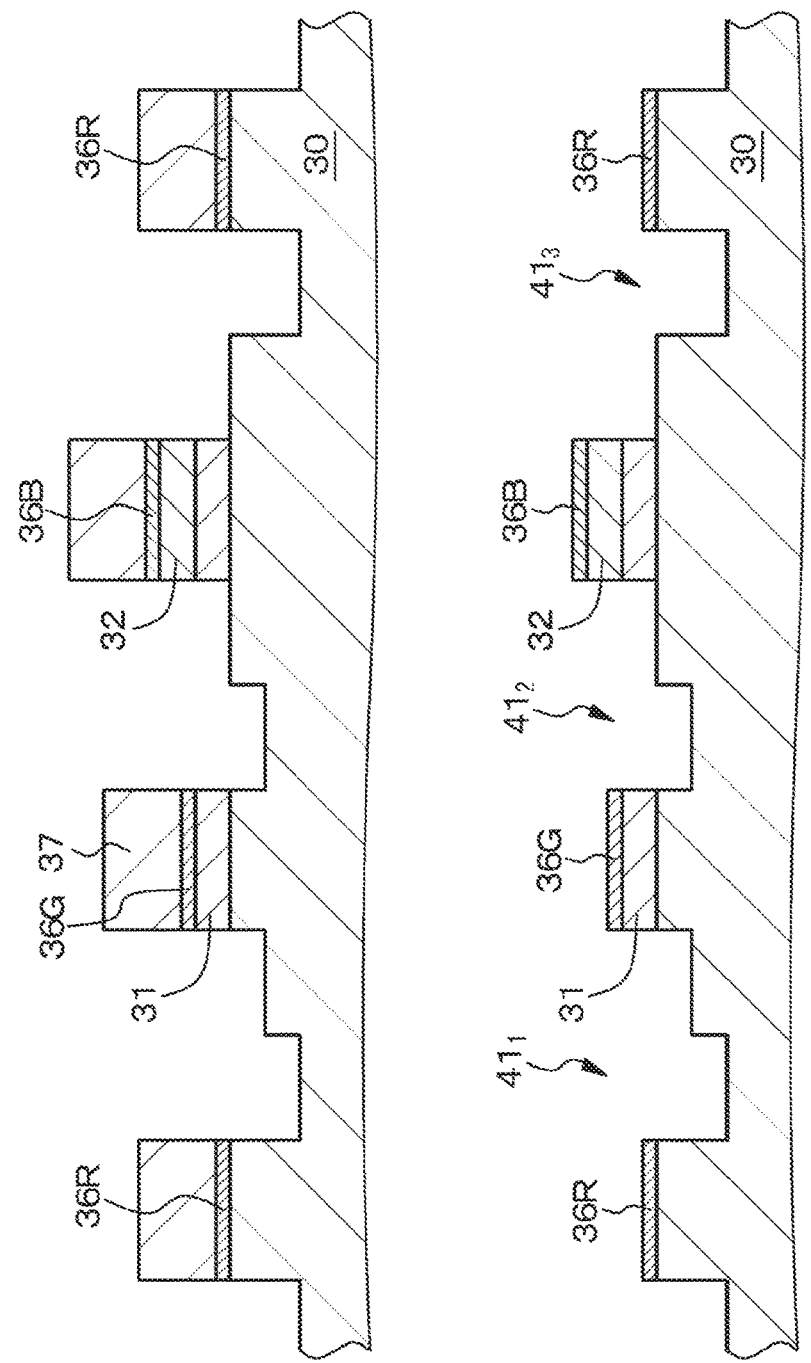
FIGS. 4A and 4B are schematic partial end views of a lowermost layer/interlayer insulation layer and the like for describing the method for manufacturing the display device of Example 1, following FIG. 3B.
Figure 6:
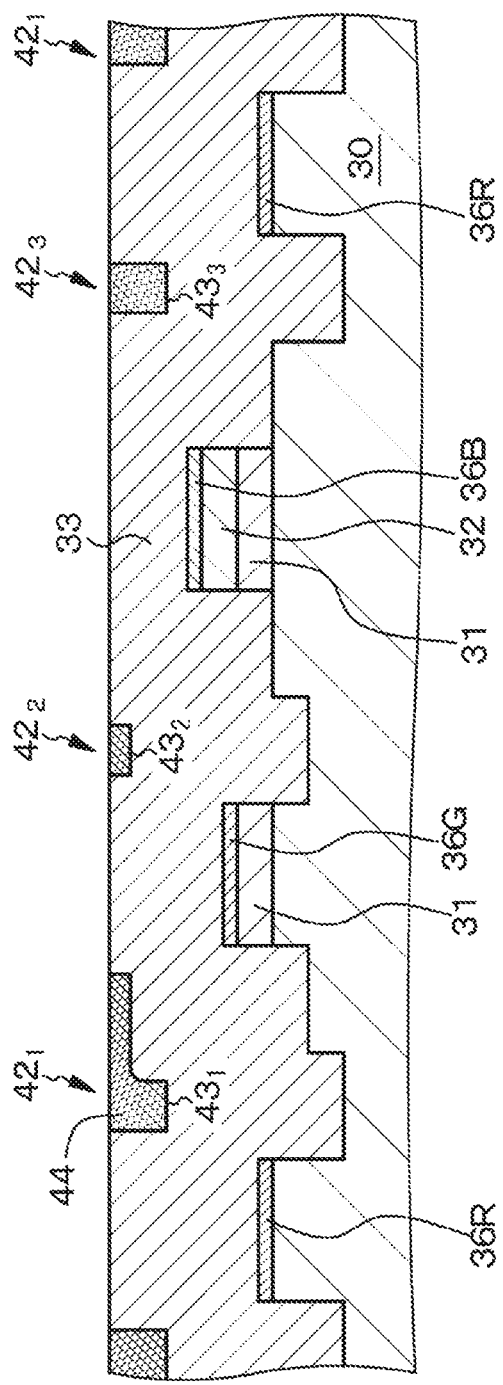
FIG. 6 is a schematic partial end view of a lowermost layer/interlayer insulation layer and the like for describing the method for manufacturing the display device of Example 1, following FIG. 5B.

Hereinafter, the present disclosure will be described on the basis of Examples with reference to the drawings. However, the present disclosure is not limited to Examples, and various numerical values and materials in Examples are illustrative. Note that description will be made in the following order.

1. General description on display device of the present disclosure and method for manufacturing the display device
2. Example 1 (display device of the present disclosure and method for manufacturing the display device)
3. Example 2 (modification of Example 1)
4. Example 3 (modification of Example 1)
5. Others <General description on Display Device of the Present Disclosure and Method for Manufacturing the Display Device>

In the following description, a laminated structure of a first interlayer insulation layer, a second interlayer insulation layer, and an uppermost layer/interlayer insulation layer may be referred to as an "interlayer insulation layer/laminated structure" for convenience.

In the method for manufacturing a display device according to the present disclosure, in step (C), a portion of a lowermost layer/interlayer insulation layer and a portion of a first interlayer insulation layer located in a boundary region between a first light emitting element and a second light emitting element may be etched to form a first recess, at the same time a portion of the first interlayer insulation layer and a portion of a second interlayer insulation layer located in a boundary region between the second light emitting element and a third light emitting element may be etched to form a second recess, and at the same time a portion of the lowermost layer/interlayer insulation layer, a portion of the first interlayer insulation layer, and a portion of the second interlayer insulation layer located in a boundary region between the first light emitting element and the third light emitting element may be etched to form a third recess.

In the method for manufacturing a display device according to the present disclosure including the above preferable form, a lowermost portion of a bottom of a first groove and a lowermost portion of a bottom of a third groove may be located at a position higher than a top surface of a first light reflecting layer, and a lowermost portion of a bottom of a second groove may be located at a position higher than a top surface of a second light reflecting layer.

In the method for manufacturing a display device according to the present disclosure including the above preferable form or the display device of the present disclosure, a lowermost portion of a bottom of a first groove and a lowermost portion of a bottom of a third groove may be located at a position closer to a first light emitting element than a third light emitting element, and a lowermost portion of a bottom of a second groove may be located at a position closer to a second light emitting element than the third light emitting element.

In the display device of the present disclosure including the above various preferable forms or a display device obtained by the method for manufacturing a display device according to the present disclosure (hereinafter, these may be collectively referred to as "the display device or the like of the present disclosure"), specific examples of a light shielding material constituting a light shielding layer include a material capable of shielding light, such as titanium (Ti), chromium (Cr), tungsten (W), tantalum (Ta), aluminum (Al), or $MoSi_2$. The light shielding layer can be formed by a vapor deposition method including an electron beam vapor deposition method, a hot filament vapor deposition method, and a vacuum vapor deposition method, a sputtering method, a CVD method, an ion plating method, or the like.

In the display device or the like of the present disclosure, the groove may be formed so as to surround a light emitting element. The groove is formed by a so-called self-alignment method. The groove does not have to be completely filled with the light shielding layer. That is, the light shielding layer only needs to cover at least a side surface and a bottom of the groove. The light shielding layer may be in contact with a first electrode. Alternatively, the light shielding layer may be grounded. The first light reflecting layer constituting the first light emitting element may be electrically connected to the first electrode constituting the first light emitting element. The second light reflecting layer constituting the second light emitting element may be electrically connected to the first electrode constituting the second light emitting element. The third light reflecting layer constituting the third light emitting element may be electrically connected to the first electrode constituting the third light emitting element. Alternatively, each light reflecting layer may be grounded.

The insulation film may be formed on a region of the upper layer/interlayer insulation layer where the first electrode is not formed and at an edge of the first electrode. That is, the insulation film may be formed on the uppermost layer/interlayer insulation layer and the first electrode, an opening may be formed in the insulation film on the first electrode, and the first electrode may be exposed to a bottom of the opening. The organic layer is formed over the insulation film from above the first electrode exposed to a bottom of the opening. Alternatively, the insulation film may be formed on the uppermost layer/interlayer insulation layer exposed between the first electrode and the first electrode. The organic layer is formed over the insulation film from above the first electrode. A material constituting the insulation film and a material constituting the uppermost layer/interlayer insulation layer may be the same as or different from each other.

The display device or the like of the present disclosure may be constituted by an organic electroluminescence display device (organic EL display device). The light emitting element may be constituted by an organic electroluminescence element (organic EL element). In addition, the lowermost layer/interlayer insulation layer, the interlayer insulation layer/laminated structure, the organic layer, and the second electrode may be common in the plurality of light emitting elements.

In the light emitting element in the present disclosure, the light emitting layer may be constituted by at least two light emitting layers that emit different colors. In this case, light emitted from the organic layer may be white. Specifically, the light emitting layer may have a structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the light emitting layer may have a structure obtained by laminating two layers of a blue light emitting layer that emits blue light and a yellow light emitting layer that emits yellow light, and emits white light as a whole. Alternatively, the light emitting layer may have a structure obtained by laminating two layers of a blue light emitting layer that emits blue light and an orange light emitting layer that emits orange light, and emits white light as a whole. In addition, such a white light emitting element that emits white light includes a red color filter to constitute a red light emitting element. The white light emitting element includes a green color filter to constitute a green light emitting element. The white light emitting element includes a blue color filter to constitute a blue light emitting element. In addition, one pixel is constituted by a red light emitting element, a green light emitting element, and a blue light emitting element. In some cases, one pixel may be constituted by a red light emitting element, a green light emitting element, a blue light emitting element, and a light emitting element that emits white light (or a light emitting element that emits complementary color light). Note that, in a mode constituted by at least two light emitting layers that emit light of different colors, there is actually a case where the light emitting layers that emit light of different colors are mixed and are not clearly separated into the layers.

The color filter is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. In a light emitting element that emits white light, it is only required to dispose a transparent filter. A black matrix layer may be formed between a color filter and a color filter. For example, the black matrix layer is constituted by a black resin film (specifically, including a black polyimide resin, for example) having an optical density of 1 or more, mixed with a black coloring agent, or a thin film filter using interference of a thin film. The thin film filter is formed by laminating two or more thin films including metal, metal nitride, or metal oxide, for example, and attenuates light by utilizing interference of a thin film. Specific examples of the thin film filter include a thin film filter obtained by alternately laminating Cr and chromium (III) oxide ($Cr_2O_3$).

Although not limited, a transistor (specifically, for example, a MOSFET) formed on a silicon semiconductor substrate may be disposed below the lowermost layer/interlayer insulation layer, and the transistor formed on the silicon semiconductor substrate may be connected to the first electrode via a contact hole (contact plug) formed in the lowermost layer/interlayer insulation layer and the interlayer insulation layer/laminated structure. Alternatively, TFTs disposed on various substrates may be disposed below the lowermost layer/interlayer insulation layer. In this way, the first electrode is disposed on the interlayer insulation layer/laminated structure, as described above. In addition, the lowermost layer/interlayer insulation layer covers a light emitting element driving unit formed on the first substrate. The light emitting element driving unit is constituted by one or more transistors (for example, MOSFET or TFT). The transistors are electrically connected to the first electrode via a contact hole disposed in the lowermost layer/interlayer insulation layer and the interlayer insulation layer/laminated structure, as described above. The light emitting element driving unit can have a known circuit configuration.

In another expression, the display device or the like of the present disclosure includes a first substrate, a second substrate, and an image display unit sandwiched by the first substrate and the second substrate. In the image display unit, a plurality of the light emitting elements in the present disclosure including the preferable forms and configurations described above is arranged in a two-dimensional matrix. Herein, the light emitting elements are formed on a side of the first substrate.

In addition, the display device or the like of the present disclosure is a top emission type display device that emits light from the second substrate. In the top emission type display device, it is only required to form a color filter and a black matrix layer on a surface side of the second substrate opposed to the first substrate. Alternatively, a color filter may be formed on a surface side of the first substrate opposed to the second substrate. That is, an on-chip color filter (OCCF) may be formed on the first substrate. In the display device or the like of the present disclosure, in a case where one pixel (or sub-pixel) is constituted by one light emitting element, examples of arrangement of pixels (or sub-pixels) include stripe arrangement, diagonal arrangement, delta arrangement, stripe arrangement, and rectangle arrangement although not being limited thereto. In addition, in a form in which one pixel (or sub-pixel) is constituted by assembly of a plurality of light emitting elements (display elements), examples of arrangement of a pixel (or sub-pixel) include stripe arrangement although not being limited thereto.

In addition to the silicon semiconductor substrate, the first substrate or the second substrate may be constituted by a high strain point glass substrate, a soda glass ($Na_2O.CaO.SiO_2$) substrate, a borosilicate glass ($Na_2O.B_2O_3.SiO_2$) substrate, a forsterite ($2MgO.(SiO_2)$) substrate, a lead glass ($Na_2O.PbO.SiO_2$) substrate, various glass substrates each having an insulation material layer formed on a surface thereof, a quartz substrate, a quartz substrate having an insulation material layer formed on a surface thereof, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, in the top emission type display device, the second substrate needs to be transparent to light emitted from the light emitting element.

In a case where the first electrode functions as an anode electrode, examples of a material constituting the first electrode include various transparent conductive materials such as a transparent conductive material including, for a base layer, indium oxide, indium-tin oxide (ITO, including Sn-doped $In_2O_3$, crystalline ITO, and amorphous ITO), indium zinc oxide (IZO), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel type oxide, oxide having a $YbFe_2O_4$ structure, gallium oxide, titanium oxide, niobium oxide, nickel oxide, or the like. The thickness of the first electrode may be 0.01 μm to 0.1 μm, for example.

Meanwhile, in a case where the second electrode is caused to function as a cathode electrode, a material constituting the second electrode (a semi-light transmitting material or a light transmitting material) is desirably constituted by a conductive material having a small work function value so as to be able to transmit emitted light and inject an electron into an organic layer efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the second electrode may have a laminated structure of the above material layer and a so-called transparent electrode (for example, thickness $3 \times 10^{-8}$ m to $1 \times 10^{-6}$ m) including, for example, ITO or IZO. A bus electrode (auxiliary electrode) including a low resistance material such as aluminum, an aluminum alloy, silver, a silver alloy, copper, a copper alloy, gold, or a gold alloy may be disposed in the second electrode to reduce resistance as the whole second electrode. Average light transmittance of the second electrode is 50% to 90%, and preferably 60% to 90%.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. Furthermore, processes from formation of the organic layer to formation of these electrodes are preferably performed without exposure thereof to the atmosphere from a viewpoint of preventing deterioration of the organic layer due to moisture in the atmosphere. As described above, the second electrode is preferably a so-called common electrode without being patterned.

Examples of materials constituting the light reflecting layer, the first light reflecting layer, the second light reflecting layer, and the third light reflecting layer include aluminum, an aluminum alloy (for example, Al—Nd or Al—Cu), an Al/Ti laminated structure, an Al—Cu/Ti laminated structure, chromium (Cr), silver (Ag), and a silver alloy (for example, Ag—Pd—Cu or Ag—Sm—Cu). The light reflecting layer, the first light reflecting layer, the second light reflecting layer, and the third light reflecting layer can be formed, for example, by a vapor deposition method including an electron beam vapor deposition method, a hot filament vapor deposition method, and a vacuum vapor deposition method, a sputtering method, a CVD method, an ion plating method; a plating method (an electroplating method or an electroless plating method); a lift-off method; a laser ablation method; a sol-gel method or the like.

The organic layer includes a light emitting layer containing an organic light emitting material. Specifically, for example, the organic layer may be constituted by a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer or the like. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of a laser absorption layer and an organic layer formed on a transfer substrate with a laser and the organic layer is transferred; and various coating methods. In a case where the organic layer is formed on the basis of the vacuum vapor deposition method, for example, using a so-called metal mask, the organic layer can be obtained by depositing a material that has passed through an aperture disposed in the metal mask, or the organic layer may be formed on the entire surface without being patterned, as described above. In some cases, at least a part of a part of the organic layer (specifically, for example, a hole transport layer) may be discontinuous at an end of the insulation film.

An insulating or conductive protective film is preferably disposed above the second electrode in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent reduction in brightness due to deterioration of the organic layer, a film formation temperature is desirably set to room temperature. Furthermore, in order to prevent peeling of the protective film, the protective film is desirably formed under a condition minimizing a stress of the protective film. In addition, the protective film is preferably formed without exposure of an already formed electrode to the atmosphere. As a result, deterioration of the organic layer due to moisture or oxygen in the atmosphere can be prevented. Furthermore, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxide/nitride ($\alpha$-SiON), and Al$_2$O$_3$. In a case where the protective film is constituted by a conductive material, the protective film is only required to be constituted by a transparent conductive material such as ITO, IZO, or IGZO. The protective film and the second substrate are bonded to each other, for example, via a resin layer (sealing resin layer). Examples of a material constituting the resin layer (sealing resin layer) include a thermosetting adhesive such as an acrylic adhesive, an epoxy-based adhesive, a urethane-based adhesive, a silicone-based adhesive, or a cyanoacrylate-based adhesive, and an ultraviolet curable adhesive.

On an outermost surface that emits light in the display device (outer surface of the second substrate), an ultraviolet absorbing layer, a contamination preventing layer, a hard coat layer, and an antistatic layer may be formed, or a protective member may be disposed.

In the display device or the like of the present disclosure, examples of an insulating material constituting the lowermost layer/interlayer insulation layer, the interlayer insulation layer/laminated structure, or the insulation film include a SiO$_x$-based material (material constituting a silicon-based oxide film) such as SiO$_2$, non-doped silicate glass (MSG), borophosphosilicate glass (BPSG), PSG, BSG, AsSG, SbSG, PbSG, spin on glass (SOG), low temperature oxide (LTO, low temperature CVD-SiO$_2$), low melting point glass, or glass paste; a SiN-based material including a SiON-based material; SiOC; SiOF; and SiCN. Examples of the insulating material further include an inorganic insulating material such as titanium oxide (TiO$_2$), tantalum oxide (Ta$_2$O$_5$), aluminum, oxide (Al$_2$O$_3$), magnesium oxide (MgO), chromium oxide (CrO$_x$), zirconium oxide (ZrO$_2$), niobium oxide (Nb$_2$O$_5$), tin oxide (SnO$_2$), or vanadium oxide (VO$_x$). Examples of the insulating material further include various resins such as a polyimide-based resin, an epoxy-based resin, and an acrylic resin; and a low dielectric constant insulating material such as SiOCH, organic SOG, or a fluorine-based resin (for example, a material having a relative dielectric constant k (=$\epsilon/\epsilon_0$) of 3.5 or less, and specific examples thereof include fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, amorphous carbon, parylene (polyparaxylylene), and fluorinated fullerene). Examples of the insulating material further include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used singly or in appropriate combination thereof. The interlayer insulation layer or the insulation film can be formed by a known method such as various CVD methods, various coating methods, various PVD methods including a sputtering method and a vacuum vapor deposition method, various printing methods such as a screen printing method, a plating method, an electrodeposition method, an immersion method, or a sol-gel method.

In order to further improve a light extraction efficiency, the organic EL display device preferably has a resonator structure. Specifically, light emitted from the light emitting layer is caused to resonate between a first interface constituted by an interface between the light reflecting layer disposed below the first electrode and the interlayer insulation layer located above the light reflecting layer and a second interface constituted by an interface between the second electrode and the organic layer, and a part of the light is emitted from the second electrode. In addition, if a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\}\le 2\times OL_1/\lambda \le 1.2\{-\Phi_1/(2\pi)+m_1\} \quad (1-1)$$

$$0.7\{-\Phi_2/(2\pi)+m_2\}\le 2\times OL_2/\lambda \le 1.2\{-\Phi_2/(2\pi)+m_2\} \quad (1-2)$$

$$L_1<L_2 \quad (1-3)$$

$$m_1<m_2 \quad (1-4)$$

Herein, $\lambda$: Maximum peak wavelength of spectrum of light generated in light emitting layer (or desired wavelength among wavelengths of light generated in light emitting layer)

$\Phi_1$: Phase shift amount (unit: radian) of light reflected on first interface Provided that $-2\pi<\Phi_1\le 0$ is satisfied.

$\Phi_2$: Phase shift amount (unit: radian) of light reflected on second interface Provided that $-2\pi<\Phi_2\le 0$ is satisfied.

Herein, $m_1=0$ and $m_2=1$ that can maximize a light extraction efficiency can be satisfied.

Note that the distance $L_1$ from the maximum emission position of the light emitting layer to the first interface means an actual distance (physical distance) from the maximum emission position of the light emitting layer to the first interface and the distance $L_2$ from the maximum emission position of the light emitting layer to the second interface means an actual distance (physical distance) from the maximum emission position of the light emitting layer to the second interface. In addition, the optical distance is also called an optical path length, and generally means n×L when a light ray passes through a medium having a refractive index n for a distance L. The same applies to the following description. Therefore, if an average refractive index is represented by $n_{ave}$, the following relations are satisfied.

$$OL_1=L_1\times n_{ave}$$

$$OL_2=L_2\times n_{ave}$$

Here, the average refractive index $n_{ave}$ is obtained by summing up a product of the refractive index and the thickness of each layer constituting the organic layer and the interlayer insulation layer, and dividing the resulting sum by the thickness of the organic layer and the interlayer insulation layer.

The light reflecting layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of each of materials constituting the light reflecting layer and the second electrode, for example, using an ellipsometer, and performing calculation based on these values (refer to, for example, "Principles of Optic", Max Born and Emil Wolf, 1974 (PERGAMON PRESS)). Note that the refractive index of the organic layer, the interlayer insulation layer, or the like can also be determined by measurement with an ellipsometer.

As described above, in an organic EL display device having a resonator structure, actually, a red light emitting element constituted by inclusion of a red color filter in a white light emitting element causes red light emitted from the light emitting layer to resonate, and emits reddish light (light having a light spectrum peak in a red region) from the second electrode. Furthermore, the green light emitting element constituted by inclusion of a green color filter in a white light emitting element causes green light emitted from the light emitting layer to resonate, and emits greenish light (light having a light spectrum peak in a green region) from the second electrode. Furthermore, the blue light emitting element constituted by inclusion of a blue color filter in a white light emitting element causes blue light emitted from the light emitting layer to resonate, and emits blueish light (light having a light spectrum peak in a blue region) from the second electrode. That is, it is only required to design each of the light emitting elements by determining a desired wavelength λ (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4). For example, paragraph [0041] of Japanese Patent Application Laid-Open No. 2012-216495 discloses an organic EL element having a resonator structure, using a light emitting layer (organic layer) as a resonance part, and describes that the film thickness of the organic layer is preferably 80 nm or more and 500 nm or less, and more preferably 150 nm or more and 350 nm or less because a distance from a light emitting point to a reflection surface can be appropriately adjusted.

In an organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. That is, by disposing a hole transport layer between the first electrode corresponding to an anode electrode and the light emitting layer, and forming the hole transport layer with a film having a film thickness smaller than the electron transport layer, supply of holes can be increased. In addition, this makes it possible to obtain a carrier balance with no excess or deficiency of holes and electrons and a sufficiently large carrier supply amount. Therefore, a high emission efficiency can be obtained. In addition, due to no excess or deficiency of holes and electrons, the carrier balance hardly collapses, drive deterioration is suppressed, and an emission lifetime can be prolonged.

The display device can be used, for example, as a monitor device constituting a personal computer, or a monitor device incorporated in a television receiver, a mobile phone, a personal digital assistant (PDA), or a game machine. Alternatively, the display device or the like of the present disclosure can be applied to an electronic view finder (EVF) or a head mounted display (HMD). Alternatively, the display device or the like of the present disclosure can constitute electronic paper such as an electronic book or electronic newspaper, a bulletin board such as a signboard, a poster, or a blackboard, rewritable paper substituted for printer paper, a display unit of a home appliance, a card display unit of a point card or the like, an electronic advertisement, or an image display device in an electronic POP. The display device of the present disclosure can be used as a light emitting device, and can constitute various lighting devices including a backlight device for a liquid crystal display device and a planar light source device. The head mounted display includes, for example, (a) a frame attached to the head of an observer and (b) an image display device attached to the frame. The image display device includes (A) the display device of the present disclosure and (B) an optical device on which light emitted from the display device of the present disclosure is incident and from which the light is emitted. The optical device includes (B-1) a light guide plate in which the light incident on the light guide plate from the display device of the present disclosure is propagated by total reflection and then from which the light is emitted toward an observer, (B-2) a first deflecting means (for example, including a volume hologram diffraction grating film) that deflects the light incident on the light guide plate such that the light incident on the light guide plate is totally reflected in the light guide plate, and (B-3) a second deflecting means (for example, including a volume hologram diffraction grating film) that deflects the light propagated in the light guide plate by total reflection a plurality of times in order to emit the light propagated in the light guide plate by total reflection from the light guide plate.

Example 1

Example 1 relates to the display device of the present disclosure and a method for manufacturing the display device. FIG. 1 illustrates a schematic partial cross-sectional view of the display device of the present disclosure. The display device of Example 1 is specifically constituted by an organic EL display device. The light emitting element of Example 1 is specifically constituted by an organic EL element.

The display device of Example 1 or a display device in the method for manufacturing the display device of Example 1 includes a plurality of pixels each including a first light emitting element 10R, a second light emitting element 10G, and a third light emitting element 10B, arranged in a two-dimensional matrix.

Each of the pixels includes a lowermost layer/interlayer insulation layer 30, a first interlayer insulation layer 31 formed on the lowermost layer/interlayer insulation layer 30, a second interlayer insulation layer 32 formed on the first interlayer insulation layer 31, and an uppermost layer/interlayer insulation layer 33.

Each of the light emitting elements 10R, 10G, and 10B includes:

a first electrode 51 formed on the uppermost layer/interlayer insulation layer 33;

an insulation film 60 formed at least on a region of the uppermost layer/interlayer insulation layer 33 where the first electrode 51 is not formed;

an organic layer 53 formed over the insulation film 60 from above the first electrode 51 and including a light emitting layer containing an organic light emitting material; and a second electrode 52 formed on the organic layer 53.

The first light emitting element 10R includes a first light reflecting layer 36R formed on the lowermost layer/interlayer insulation layer 30.

The second light emitting element 10G includes a second light reflecting layer 36G formed on the first interlayer insulation layer 31.

The third light emitting element 10B includes a third light reflecting layer 36B formed on the second interlayer insulation layer 32.

In addition, in the display device of Example 1, the uppermost layer/interlayer insulation layer 33 covers the lowermost layer/interlayer insulation layer 30, the first light reflecting layer 36R, the second light reflecting layer 36G, and the third light reflecting layer 36B, a first groove 42$_1$ is formed in a portion of the uppermost layer/interlayer insulation layer 33 located in a boundary region between the first light emitting element 10R and the second light emitting element 10G, a second groove 42$_2$ is formed in a portion of the uppermost layer/interlayer insulation layer 33 located in a boundary region between the second light emitting element 10G and the third light emitting element 10B, and a third groove 42$_3$ is formed in a portion of the uppermost layer/interlayer insulation layer 33 located in a boundary region between the first light emitting element 10R and the third light emitting element 10B. In addition, a light shielding layer 44 is formed inside the first groove 42$_1$, the second groove 42$_2$, and the third groove 42$_3$, a lowermost portion of a bottom 43$_1$ of the first groove 42$_1$ and a lowermost portion of a bottom 43$_3$ of the third groove 42$_3$ are located at a position higher than a top surface of the first light reflecting layer 36R, and a lowermost portion of a bottom 43$_2$ of the second groove 42$_2$ is located at a position higher than a top surface of the second light reflecting layer 36G.

In other words, the lowermost portion of the bottom 43$_1$ of the first groove 42$_1$ and the lowermost portion of the bottom 43$_3$ of the third groove 42$_3$ are located on a side closer to a top surface of the uppermost layer/interlayer insulation layer 33 than a top surface of the first light reflecting layer 36R, and the lowermost portion of the bottom 43$_2$ of the second groove 42$_2$ is located on a side closer to a top surface of the uppermost layer/interlayer insulation layer 33 than a top surface of the second light reflecting layer 36G. Note that the lowermost portion of the bottom 43$_1$ of the first, groove 42$_1$, the lowermost portion of the bottom 43$_2$ of the second groove 42$_2$, and the lowermost portion of the bottom 43$_3$ of the third groove 42$_3$ refer to the closest portion to the lowermost layer/interlayer insulation layer 30.

In addition, the lowermost portion of the bottom 43$_1$ of the first groove 42$_1$ and the lowermost portion of the bottom 43$_3$ of the third groove 42$_3$ are located at a position closer to the first light emitting element 10R than the third light emitting element 10B, and the lowermost portion of the bottom 43$_2$ of the second groove 42$_2$ is located at a position closer to the second light emitting element 10G than the third light emitting element 10B.

Note that the first interlayer insulation layer 31, the second interlayer insulation layer 32, and the uppermost layer/interlayer insulation layer 33 are collectively referred to as an interlayer insulation layer/laminated structure 34. The lowermost layer/interlayer insulation layer 30, the interlayer insulation layer/laminated structure 34, the organic layer 53, and the second electrode 52 are common in the plurality of light emitting elements. The insulation film 60 extends to a top surface of an edge of the first electrode 51.

In another expression, the display device of Example 1 includes a first substrate 11, a second substrate 12, and an image display unit 13 sandwiched by the first substrate 11 and the second substrate 12. In the image display unit 13, the plurality of light emitting elements 10R, 10G, and 10B of Example 1 is arranged in a two-dimensional matrix. Here, the light emitting elements are formed on a side of the first substrate 11. In addition, the display device of Example 1 is a top emission type display device that emits light from the second substrate 12. In the top emission type display device, color filters $CF_R$, $CF_G$, and $CF_B$, and a black matrix layer BM are formed on a surface side of the second substrate 12 opposed to the first substrate 11. One sub-pixel is constituted by one light emitting element.

One pixel is constituted by three light emitting elements of the red light emitting element 10R, the green light emitting element 10G, and the blue light emitting element 10B. The second substrate 12 includes the color filters $CF_R$, $CF_G$, and $CF_B$. The organic EL element emits white light, and the light emitting elements 10R, 10G, and 10B are constituted by a combination of a white light emitting element that emits white light and the color filters $CF_R$, $CF_G$, and $CF_B$, respectively. That is, the light emitting layer emits white light as a whole. In addition, a black matrix layer BM is disposed between a color filter and a color filter. The number of pixels is, for example, 1920×1080. One light emitting element (display element) constitutes one sub-pixel, and the number of light emitting elements (specifically, organic EL elements) is three times the number of pixels.

The first electrode 51 functions as an anode electrode, and the second electrode 52 functions as a cathode electrode. The first electrode 51 is made by including a transparent conductive material such as ITO having a thickness of 0.01 μm to 0.1 μm, and the second electrode 52 is made by including a Mg—Ag alloy having a thickness of 4 nm to 20 nm. The first electrode 51 is formed on the basis of a combination of a vacuum vapor deposition method and an etching method. Furthermore, a film of the second electrode 52 is formed by a film formation method in which energy of film formation particles is small, such as a vacuum vapor deposition method, and is not patterned. The organic layer 53 is not patterned, either. The first light reflecting layer 36R, the second light reflecting layer 36G, and the third light reflecting layer 36B have a laminated structure of aluminum (Al)-copper (Cu)/titanium (Ti). Furthermore, the first substrate 11 includes a silicon semiconductor substrate, and the second substrate 12 includes a glass substrate.

In addition, the light shielding layer 44 includes tungsten (W), the lowermost layer/interlayer insulation layer 30 includes $SiO_2$, the first interlayer insulation layer 31 includes SiN, the second interlayer insulation layer 32 includes $SiO_2$, the uppermost layer/interlayer insulation layer 33 includes $SiO_2$, and the insulation film 60 includes SiON. However, materials constituting these layers are not limited to these materials.

In Example 1, the organic layer 53 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and light emitted from the organic layer 53 is white. Specifically, the light emitting layer has a structure in which three layers of a red light emitting layer that emits red light, a green light emitting layer that emits green light, and a blue light emitting layer that emits blue light are laminated. The light emitting layer may have a structure in which two layers of a blue light emitting layer that emits blue light and a yellow light emitting layer that emits yellow light are laminated or a structure in which two layers of a blue light emitting layer that emits blue light and an orange light emitting layer that emits orange light are laminated. The red light emitting element 10R to display a red color includes the red color filter $CF_R$. The green light emitting element 10G to display a green color includes the green color filter $CF_G$. The blue light emitting element 10B to display a blue color includes the blue color filter $CF_B$. The red light emitting element 10R, the green light emitting element 10G, and the blue light emitting element 10B have the same configuration and structure except for the color filters and positions of the light reflecting layer. The black matrix layer BM is formed between a color filter CF and a color filter CF. In addition, the color filter CF and the black matrix layer BM are formed on a surface side of the second substrate 12 opposed to the first substrate 11. This makes it possible to shorten a distance between the light emitting layer and the color filter CF and to suppress color mixing caused by incidence of light emitted from the light emitting layer on an adjacent color filter CF of another color.

The hole injection layer increases a hole injection efficiency, functions as a buffer layer for preventing leakage, and has a thickness of about 2 nm to 10 nm, for example. The hole injection layer includes a hexaazatriphenylene derivative represented by the following formula (A) or (B), for example.

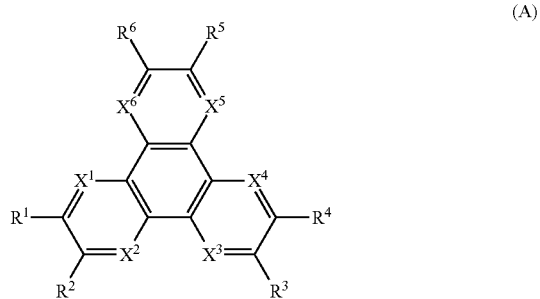

(A)

Herein, $R^1$ to $R^6$ each independently represent a substituent selected from a hydrogen atom, a halogen atom, a hydroxy group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$s (m=1 to 6) may be bonded to each other via a cyclic structure. In addition, $X^1$ to $X^6$ each independently represent a carbon atom or a nitrogen atom.

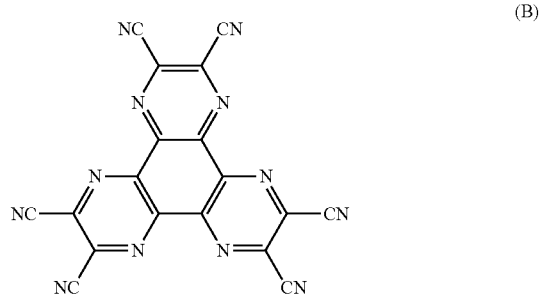 [SMILES: N#Cc1nc2c3nc(C#N)c(C#N)nc3c3nc(C#N)c(C#N)nc3c2nc1C#N]

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer includes 4,4',4"-tris(3-methylphenylphenylamino) triphenylamine <m-MTDATA> or α-naphthylphenyl diamine <αNPD> having a thickness of about 40 nm, for example.

The light emitting layer is a light emitting layer that generates white light by color mixing, and is formed by laminating a red light emitting layer, a green light emitting layer, and a blue light emitting layer as described above, for example.

When an electric field is applied to the red light emitting layer, a part of holes injected from the first electrode 51 and a part of electrons injected from the second electrode 52 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene <BSN> with 4,4-bis(2,2-diphenylvinyl) biphenyl <DPVBi>, for example.

In the green light emitting layer, by application of an electric field, a part of holes injected from the first electrode 51 and a part of electrons injected from the second electrode 52 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

In the blue light emitting layer, by application of an electric field, a part of holes injected from the first electrode 51 and a part of electrons injected from the second electrode 52 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis[2-{4-(N,N-diphenylamino) phenyl} vinyl] biphenyl <DPAVBi> with DPVBi, for example.

The electron transport layer having a thickness of about 20 nm includes 8-hydroxyquinoline aluminum <Alq3>, for example. The electron injection layer having a thickness of about 0.3 nm includes LiF, $Li_2O$, or the like, for example.

An insulating or conductive protection film 14 (specifically, including SiN, ITO, IGZO, or IZO, for example) is disposed above the second electrode 52 in order to prevent moisture from reaching the organic layer 53. Furthermore, the protective film 14 and the second substrate 12 are bonded to each other via a resin layer (sealing resin layer) 15 including an epoxy-based adhesive, for example.

In addition, the lowermost layer/interlayer insulation layer 30, the interlayer insulation layer/laminated structure 34, the organic layer 53, and the second electrode 52 are common in the plurality of light emitting elements. That is, the lowermost layer/interlayer insulation layer 30, the interlayer insulation layer/laminated structure 34, the organic layer 53, and the second electrode 52 are not patterned and are in a so-called solid film state. As described above, by forming a solid film of a light emitting layer common in all the light emitting elements without forming the light emitting layer separately for each light emitting element (patterning formation), the light emitting elements can be also applied to a small and high-resolution display device having a field angle of several inches or less and a pixel pitch of several tens of micrometers or less, for example.

A light emitting element has a resonator structure using the organic layer 53 as a resonance part. Incidentally, in order to appropriately adjust a distance from a light emitting surface to a reflecting surface (specifically, a distance from a light emitting surface to the light reflecting layer 36R, 36G, or 36B and the second electrode 52), the thickness of the organic layer 53 is preferably $8 \times 10^{-8}$ m or more and $5 \times 10^{-7}$ m or less, and more preferably $1.5 \times 10^{-7}$ m or more and $3.5 \times 10^{-7}$ m or less. In an organic EL display device having a resonator structure, actually, the red light emitting element 10R causes red light emitted from the light emitting layer to resonate, and emits reddish light (light having a light spectrum peak in a red region) from the second electrode 52. In addition, the green light emitting element 10G causes green light emitted from the light emitting layer to resonate, and emits greenish light (light having a light spectrum peak in a green region) from the second electrode 52. Furthermore, the blue light emitting element 10B causes blue light emitted from the light emitting layer to resonate, and emits bluish light (light having a light spectrum peak in a blue region) from the second electrode 52.

In Example 1, a transistor (specifically, for example, MOSFET) 20 formed on a silicon semiconductor substrate (first substrate 11) is disposed under the lowermost layer/interlayer insulation layer 30. In addition, the first electrode 51 is connected to the transistor 20 formed on the silicon semiconductor substrate (first substrate 11) via a contact hole (contact plug) formed in the lowermost layer/interlayer insulation layer 30 and the interlayer insulation layer/laminated structure 34. Note that the contact hole is not illustrated. Here, the transistor 20 including a MOSFET is constituted by a gate electrode 21, a gate insulation layer 22, a channel formation region 23, and a source/drain region 24. An element isolation region 25 is formed between the transistors 20, and the transistors 20 are thereby separated from each other.

Hereinafter, the method for manufacturing the display device of Example 1 will be described with reference to FIGS. 2A, 2B, 2C, 3A, 3B, 4A, 4B, 5A, 5B, and 6 which are schematic partial end views of the lowermost layer/interlayer insulation layer and the like.

[Step-100]

First, a light emitting element driving unit is formed on a silicon semiconductor substrate (first substrate 11) on the basis of a known MOSFET manufacturing process.

[Step-110]

Subsequently, the lowermost layer/interlayer insulation layer 30, the patterned first interlayer insulation layer 31, and the patterned second interlayer insulation layer 32 are formed. Specifically, the lowermost layer/interlayer insulation layer 30 is formed on the entire surface on the basis of a CVD method. Thereafter, the first interlayer insulation layer 31 and the second interlayer insulation layer 32 are sequentially formed on the lowermost layer/interlayer insulation layer 30 on the basis of the CVD method. Then, the second interlayer insulation layer 32 is patterned, and the first interlayer insulation layer 31 is further patterned on the basis of a known RIE method. In this way, the structure illustrated in FIG. 2A can be obtained.

[Step-120]

Thereafter, a light reflecting layer 35 is formed on the entire surface on the basis of a sputtering method (refer to FIG. 2B), and then a resist layer 37 is formed on the basis of a photolithography technique. In this way, the structure illustrated in FIG. 2C can be obtained.

Then, the light reflecting layer 35 is patterned on the basis of a known RIE method. In this way, the first light reflecting layer 36R can be formed on a region of the lowermost layer/interlayer insulation layer 30 where the first light emitting element 10R is to be formed, the second light reflecting layer 36G can be formed on a region of the first interlayer insulation layer 31 where the second light emitting element 10G is to be formed, and the third light reflecting layer 36B can be formed on a region of the second interlayer insulation layer 32 where the third light emitting element 10B is to be formed (refer to FIG. 3A).

[Step-130]

Thereafter, at least a portion of the first interlayer insulation layer 31 located in a boundary region between the first light emitting element 10R and the second light emitting element 10G (in Example 1, specifically, a portion of the lowermost layer/interlayer insulation layer 30 and a portion of the first interlayer insulation layer 31 located in a boundary region between the first light emitting element 10R and the second light emitting element 10G) is etched to form a first recess $41_1$. At the same time, at least a portion of the second interlayer insulation layer 32 located in a boundary region between the second light emitting element 10G and the third light emitting element 10B (in Example 1, specifically, a portion of the first interlayer insulation layer 31 and a portion of the second interlayer insulation layer 32 located in a boundary region between, the second, light emitting element 10G and the third light emitting element 10B) is etched to form a second recess $41_2$. At the same time, at least a portion of the first interlayer insulation layer 31 and a portion of the second interlayer insulation layer 32 located in a boundary region between the first light emitting element 10R and the third light emitting element 10B (in Example 1, specifically, a portion of the lowermost layer/interlayer insulation layer 30, a portion of the first interlayer insulation layer 31, and a portion of the second interlayer insulation layer 32 located in a boundary region between the first light emitting element 10R and the third light emitting element 101B) is etched to form a third recess $41_3$. For the above steps, refer to FIGS. 3B and 4A. Then, the resist layer 37 is removed. In this way, the structure illustrated in FIG. 4B can be obtained.

[Step-140]

Next, the uppermost layer/interlayer insulation layer 33 is formed on the entire surface on the basis of a plasma CVD method (refer to FIG. 5A). Thereafter, the uppermost layer/interlayer insulation layer 33 is flattened on the basis of a CMP method. In this way, as illustrated in FIG. 5B, the first groove $42_1$, the second groove $42_2$, and the third groove $42_3$ are formed in a portion of the uppermost layer/interlayer insulation layer 33 above the first recess $41_1$, the second recess $41_2$, and the third recess $41_3$, respectively. These grooves $42_1$, $42_2$, and $42_3$ are formed by a self-alignment method.

[Step-150]

Thereafter, the light shielding layer 44 is formed inside the first groove $42_1$, the second groove $42_2$, and the third groove $42_3$. Specifically, a tungsten layer is formed on the entire surface on the basis of a tungsten CVD method, and the tungsten layer on the uppermost layer/interlayer insulation layer 33 is removed on the basis of a CMP method. In this way, the structure illustrated in FIG. 6 can be obtained.

A lowermost portion of the bottom $43_1$ of the first groove $42_1$ and a lowermost portion of the bottom $43_3$ of the third groove $42_3$ are located at a position higher than a top surface of the first light reflecting layer 36R, and a lowermost portion of the bottom $43_2$ of the second groove $42_2$ is located at a position higher than a top surface of the second light reflecting layer 36G. In addition, a lowermost portion of the bottom $43_1$ of the first groove $42_1$ and the lowermost portion of the bottom $43_3$ of the third groove $42_3$ are located at a position closer to the first light emitting element 10R than the third light emitting element 10B, and a lowermost portion of the bottom $43_2$ of the second groove $42_2$ is located at a position closer to the second light emitting element 10G than the third light emitting element 10B.

[Step-160]

Then, a connection hole is formed in a portion of the lowermost layer/interlayer insulation layer 30 and the interlayer insulation layer/laminated structure 34 located above one of source/drain regions of the transistor 20 on the basis of a photolithography technique and an etching technique. Thereafter, a metal layer is formed on the uppermost layer/interlayer insulation layer 33 including the connection hole on the basis of a sputtering method, for example. Subsequently, the metal layer is patterned on the basis of a photolithography technique and an etching technique, and the first electrode 51 can be thereby formed on the uppermost layer/interlayer insulation layer 33. The first electrode 51 is separated for each of the light emitting elements. At the same time, a contact hole (contact plug) (not illustrated) for electrically connecting the first electrode 51 to the transistor 20 can be formed in the connection hole. Note that the contact hole may be formed simultaneously with forming the light shielding layer 44 inside the first groove $42_1$, the second groove $42_2$, and the third groove $42_3$.

[Step-170]

Subsequently, the insulation film 60 is formed on the entire surface, for example, on the basis of a CVD method.

Thereafter, an opening 61 is formed in a part of the insulation film 60 on the first electrode 51 on the basis of a photolithography technique and an etching technique. The first electrode 51 is exposed to a bottom of the opening 61.

[Step-180]

Thereafter, a film of the organic layer 53 is formed on the first electrode 51 and the insulation film 60 by a PVD method such as a vacuum vapor deposition method or a sputtering method, or a coating method such as a spin coating method or a die coating method, for example. Subsequently, the second electrode 52 is formed on the entire surface of the organic layer 53 on the basis of a vacuum vapor deposition method or the like, for example. In this way, films of the organic layer 53 and the second electrode 52 can be continuously formed on the first electrode 51, for example, in a vacuum atmosphere. Thereafter, the protective film 14 is formed on the entire surface by a CVD method or a PVD method, for example. Finally, the protective film 14 and the second substrate 12 are bonded to each other via the resin layer (sealing resin layer) 15. Note that the color filters $CF_R$, $CF_G$, and $CF_B$, and the black matrix layer BM are formed in advance on the second substrate 12. Then, a surface on which the color filter CF is formed is used as a bonding surface. In this way, the organic EL display device illustrated in FIG. 1 can be obtained.

As described above, in the method for manufacturing the display device of Example 1, in [step-150], the light shielding layer 44 is formed inside the first groove $42_1$, the second groove $42_2$, and the third groove $42_3$. In addition, in the display device of Example 1, the light shielding layer 44 is formed inside the first groove $42_1$, the second groove $42_2$, and the third groove $42_3$. Therefore, it is possible to manufacture a display device hardly causing entry of light into an adjacent light emitting element. That is, it is possible to reduce a ratio at which light emitted from a certain light emitting element enters an adjacent light emitting element, and to suppress occurrence of a phenomenon that color mixing occurs and chromaticity of the entire pixels is shifted from desired chromaticity. In addition, color mixing can be prevented. Therefore, color purity increases when monochromatic light is emitted from a pixel, and a chromaticity point is deep. Therefore, a color gamut is widened, and a range of color expression of the display device is widened. In addition, a color filter is disposed for each pixel in order to increase color purity. This makes it possible to reduce the film thickness of the color filter or to omit the color filter, and makes it possible to extract light absorbed by the color filter. As a result, this leads to improvement of luminous efficiency.

Furthermore, in [step-140], the uppermost layer/interlayer insulation layer 33 is formed on the entire surface, and then the uppermost layer/interlayer insulation layer 33 is flattened. The first groove $42_1$, the second groove $42_2$, and the third groove $42_3$ can be thereby formed by a so-called self-alignment method. Therefore, a light emitting element can be micronized. Furthermore, a relationship between lowermost portions of the bottoms $43_1$, $43_2$, and $43_3$ of grooves and the heights of top surfaces of the light reflecting layers 36R, 36G, and 36B is defined. Therefore, it is possible to reliably prevent contact between the grooves $42_1$, $42_2$, and $42_3$ and the light reflecting layers 36R, 36G, and 36B, and to avoid occurrence of a problem such as variation in luminescent color.

Example 2

Figure 7:
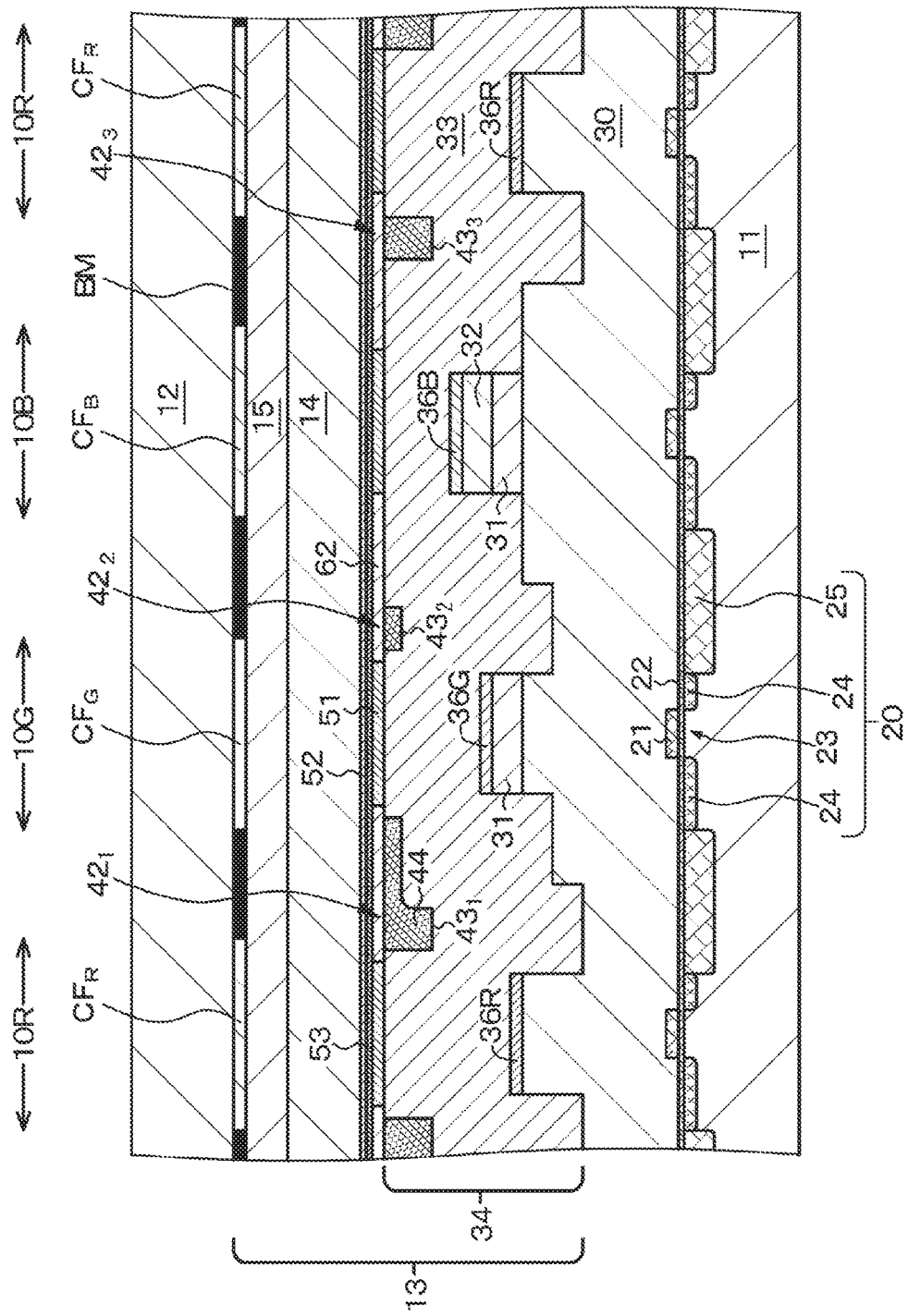
FIG. 7 is a schematic partial cross-sectional view of a display device of Example 2.
Figure 8:
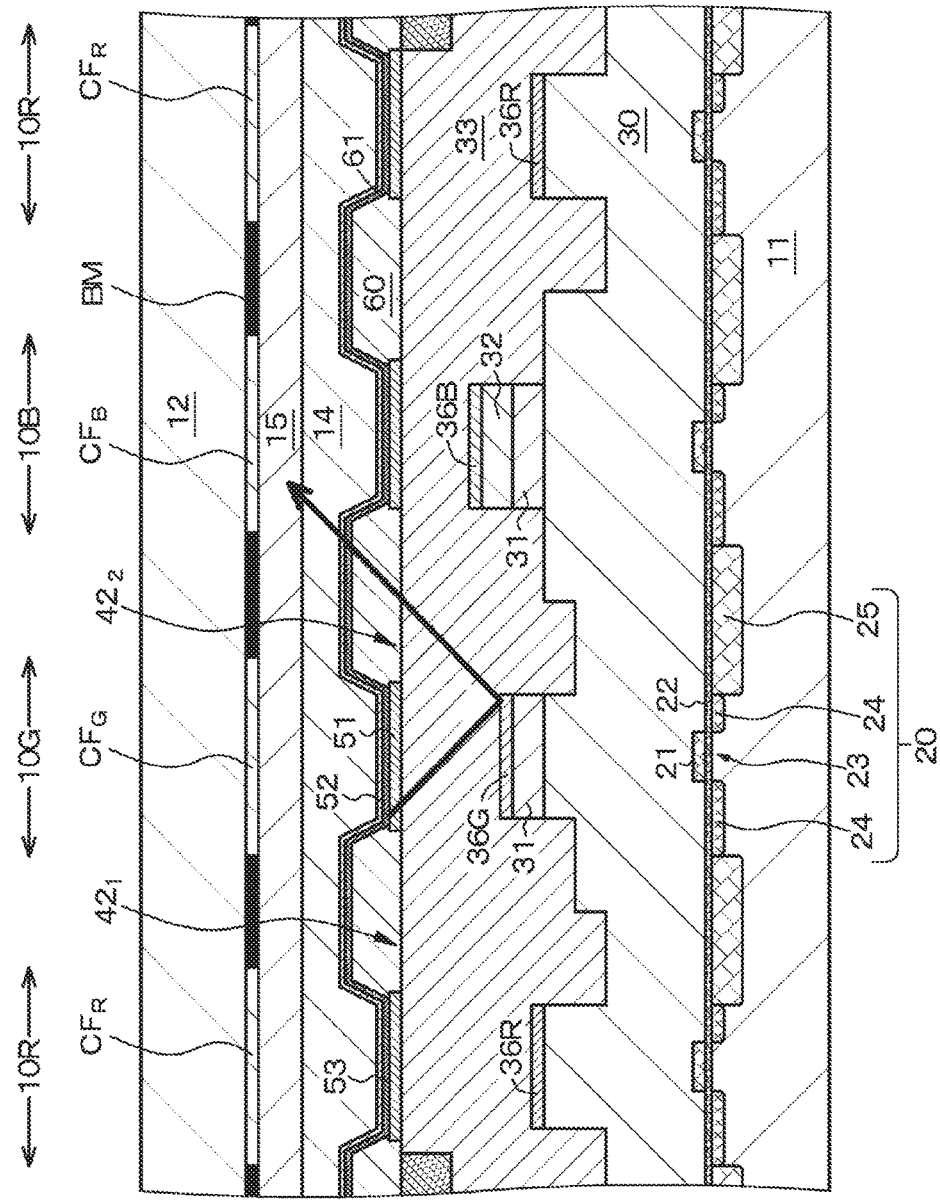
FIG. 8 is a schematic partial cross-sectional view of a display device for describing a problem of a conventional display device.

Example 2 is a modification of Example 1. As illustrated in a schematic partial cross-sectional view in FIG. 7, an insulation film 62 including SiON, SiO$_2$, or a polyimide resin is formed on a region of the uppermost layer/interlayer insulation layer 33 where the first electrode 51 is not formed. The organic layer 53 is formed on the first electrode 51 and the insulation film 62 which are flat as a whole, and the organic layer 53 is also flat. In this way, by forming the organic layer 53 on the first electrode 51 and the insulation film 62 which are flat as a whole, it is possible to prevent occurrence of a problem such as abnormal light emission at an end of an opening of the insulation film.

In the display device of Example 2, for example, in a similar step to [Step-170] of Example 1, by performing a flattening treatment after the insulation film 62 is formed on the entire surface, for example, on the basis of a CVD method, it is only required to leave the insulation film 62 on a region of the uppermost layer/interlayer insulation layer 33 where the first electrode 51 is not formed. The configurations and structures of the light emitting element and the display device of Example 2 can be similar to those of the light emitting element and the display device of Example 1 except for the above points, and therefore detailed description will be omitted.

Example 3

Example 3 is a modification of Example 1.

By the way, a phenomenon that a leakage current flows between the first electrode in a certain light emitting element and the second electrode constituting an adjacent light emitting element may occur. In addition, when such a phenomenon occurs, light emission occurs in a light emitting element which should not emit light originally. Meanwhile, intensity of an electric field in a light emitting element which should emit light is reduced. As a result, blurring may occur in an image, or the chromaticity of the entire pixels may be shifted from desired chromaticity. In order to solve such a problem, in Example 3, at the time of film formation of the organic layer 53, at least a part of a part (specifically, for example, hole injection layer) of the organic layer 53 is made discontinuous at an end of the insulation film 60, specifically, at an edge of the opening 61 disposed in the insulation film 60. In this way, for example, by making at least a part of a hole injection layer discontinuous, the resistance of the hole injection layer is increased, and occurrence of a phenomenon that a leakage current flows between the first electrode in a certain light emitting element and the second electrode constituting an adjacent light emitting element can be reliably prevented.

In order to make at least a part of the hole injection layer discontinuous, it is only required to optimize an inclination state of an edge of the opening 61 disposed in the insulation film 60, and to optimize film formation conditions of the hole injection layer. Alternatively, for example, in the display device described in Example 1, it is only required to form a second insulation film having an end (eaves-like end) protruding into the opening 61 on the insulation film 60, and to make at least a part of the hole injection layer discontinuous at a protruding end of the second insulation film.

Alternatively, [step 160] of Example 1 is performed, and then a kind of sacrificial layer is formed on the entire surface. Subsequently, the insulation film 60 is formed, and the opening 61 is formed in a part of the insulation film 60 in a similar manner to [step-170] of Example 1. The sacrificial layer is exposed to a bottom of the opening 61. The sacrificial layer formed in a portion of the uppermost layer/interlayer insulation layer 33 located between the first electrode 51 and the first electrode 51 is covered with the insulation film 60. Then, a portion of the sacrificial layer exposed to the bottom of the opening 61 is removed. A gap is generated between the first electrode 51 and the portion of the insulation film 60 located above the first electrode 51 due to removal of the sacrificial layer. That is, the portion of the insulation film 60 located above the first electrode 51 has a kind of eaves-like shape. Therefore, by forming a hole injection layer in this state, at least a part of the hole injection layer can be made discontinuous.

Hitherto, the present disclosure has been described on the basis of the preferable Examples. However, the present disclosure is not limited to these Examples. The configurations and structures of the display device (organic EL display device) and the light emitting element (organic EL element) described in Examples are illustrative and can be changed appropriately. The method for manufacturing the display device is also illustrative and can be changed appropriately. In Examples, one pixel is constituted exclusively by three sub-pixels using a combination of a white light emitting element and a color filter. However, for example, one pixel may be constituted by four sub-pixels obtained by adding a light emitting element that emits white light. In Examples, the light emitting element driving unit is constituted by a MOSFET, but can be also constituted by a TFT.

In Examples, the lowermost layer/interlayer insulation layer, the patterned first interlayer insulation layer, and the patterned second interlayer insulation layer are formed, then the light reflecting layer is formed on the entire surface, and then the light reflecting layer is patterned to form, the first light reflecting layer, the second light reflecting layer, and the third light reflecting layer. Subsequently, the first recess, the second recess, and the third recess are formed. That is, steps (A), (B), and (C) in the method for manufacturing a display device according to the present disclosure are performed. However, alternatively, for example, the following steps may be adopted.

[Step-A] forming a first light reflecting layer on a region of a lowermost layer/interlayer insulation layer where a first light emitting element is to be formed, then

[Step-B] forming a first interlayer insulation layer on the lowermost layer/interlayer insulation layer and then forming a second light reflecting layer on the first interlayer insulation layer, then

[Step-C] forming a second interlayer insulation layer on the first interlayer insulation layer and then forming a third light reflecting layer on the second interlayer insulation layer, and then

[Step-D] removing a desired portion of the second interlayer insulation layer, the first interlayer insulation layer, and the lowermost layer/interlayer insulation layer by etching, forming a first recess at least in a portion of the first interlayer insulation layer located in a boundary region between a first light emitting element and a second light emitting element (specifically, for example, a portion of the lowermost layer/interlayer insulation layer and a portion of the first interlayer insulation layer), at the same time, forming a second recess at least in a portion of the second interlayer insulation layer located in a boundary region between the second light emitting element and a third light emitting element (specifically, for example, a portion of the first interlayer insulation layer and a portion of the second interlayer insulation layer), and at the same time, forming a third recess at least in a portion of the first interlayer insulation layer and a portion of the second interlayer insulation layer located in a boundary region between the first light emitting element and the third light emitting element (specifically, for example, a portion of the lowermost layer/interlayer insulation layer, a portion of the first interlayer insulation layer, and a portion of the second interlayer insulation layer).

Note that the present disclosure may have the following configurations.

[A01] <<Method for Manufacturing Display Device>>

A method for manufacturing a display device including a plurality of pixels each including a first light emitting element, a second light emitting element, and a third light emitting element, arranged in a two-dimensional matrix, each of the pixels including a lowermost layer/interlayer insulation layer, a first interlayer insulation layer formed on the lowermost layer/interlayer insulation layer, a second interlayer insulation layer formed on the first interlayer insulation layer, and an uppermost layer/interlayer insulation layer, each of the light emitting elements including:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode and including a light emitting layer containing an organic light emitting material; and a second electrode formed on the organic layer, the first light emitting element including a first light reflecting layer formed on the lowermost layer/interlayer insulation layer, the second light emitting element including a second light reflecting layer formed on the first interlayer insulation layer, and the third light emitting element including a third light reflecting layer formed on the second interlayer insulation layer, the method including:

(A) forming a lowermost layer/interlayer insulation layer, a patterned first interlayer insulation layer, and a patterned second interlayer insulation layer; then (B) forming a light reflecting layer on the entire surface and then patterning the light reflecting layer to form a first light reflecting layer on a region of the lowermost layer/interlayer insulation layer where a first light emitting element is to be formed, to form a second light reflecting layer on a region of the first interlayer insulation layer where a second light emitting element is to be formed, and to form a third light reflecting layer on a region of the second interlayer insulation layer where a third light emitting element is to be formed; then (C) etching at least a portion of the first interlayer insulation layer located in a boundary region between the first light emitting element and the second light emitting element to form a first recess, at the same time etching at least a portion of the second interlayer insulation layer located in a boundary region between the second light emitting element and the third light emitting element to form a second recess, and at the same time etching at least a portion of the first interlayer insulation layer and a portion of the second interlayer insulation layer located in a boundary region between the first light emitting element and the third light emitting element to form a third recess; then (D) forming an uppermost layer/interlayer insulation layer on the entire surface and then flattening the uppermost layer/interlayer insulation layer to form a first groove, a second groove, and a third groove in a portion of the uppermost layer/interlayer insulation layer above the first recess, the second recess, and the third recess, respectively; and then (E) forming a light shielding layer inside the first groove, the second groove, and the third groove.

[A02] The method for manufacturing a display device according to [A01], in which, in step (C), a portion of the lowermost layer/interlayer insulation layer and a portion of the first interlayer insulation layer located in a boundary region between the first light emitting element and the second light emitting element are etched to form a first recess, at the same time a portion of the first interlayer insulation layer and a portion of the second interlayer insulation layer located in a boundary region between the second light emitting element and the third light emitting element are etched to form a second recess, and at the same time a portion of the lowermost layer/interlayer insulation layer, a portion of the first interlayer insulation layer, and a portion of the second interlayer insulation layer located in a boundary region between the first light emitting element and the third light emitting element are etched to form a third recess.

[A03] The method for manufacturing a display device according to [A01] or [A02], in which a lowermost portion of a bottom of the first groove and a lowermost portion of a bottom of the third groove are located at a position higher than a top surface of the first light reflecting layer, and a lowermost portion of a bottom of the second groove is located at a position higher than a top surface of the second light reflecting layer.

[A04] The method for manufacturing a display device according to any one of [A01] to [A03], in which the lowermost portion of the bottom of the first groove and the lowermost portion of the bottom of the third groove are located at a position closer to the first light emitting element than the third light emitting element, and the lowermost portion of the bottom of the second groove is located at a position closer to the second light emitting element than the third light emitting element.

[B01] <<Display Device>>

A display device including a plurality of pixels each including a first light emitting element, a second light emitting element, and a third light emitting element, arranged in a two-dimensional matrix, in which each of the pixels includes a lowermost layer/interlayer insulation layer, a first interlayer insulation layer formed on the lowermost layer/interlayer insulation layer, a second interlayer insulation layer formed on the first interlayer insulation layer, and an uppermost layer/interlayer insulation layer, each of the light emitting elements includes:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode and including a light emitting layer containing an organic light emitting material; and a second electrode formed on the organic layer, the first light emitting element includes a first light reflecting layer formed on the lowermost layer/interlayer insulation layer, the second light emitting element includes a second light reflecting layer formed on the first interlayer insulation layer, the third light emitting element includes a third light reflecting layer formed on the second interlayer insulation layer, the uppermost layer/interlayer insulation layer covers the lowermost layer/interlayer insulation layer, the first light reflecting layer, the second light reflecting layer, and the third light reflecting layer, a first groove is formed in a portion of the uppermost layer/interlayer insulation layer located in a boundary region between the first light emitting element and the second light emitting element, a second groove is formed in a portion of the uppermost layer/interlayer insulation layer located in a boundary region between the second light emitting element and the third light emitting element, a third groove is formed in a portion of the uppermost layer/interlayer insulation layer located in a boundary region between the first light emitting element and the third light emitting element, a light shielding layer is formed inside the first groove, the second groove, and the third groove, a lowermost portion of a bottom of the first groove and a lowermost portion of a bottom of the third groove are located at a position higher than a top surface of the first light reflecting layer, and a lowermost portion of a bottom of the second groove is located at a position higher than a top surface of the second light reflecting layer.

[B02] The display device according to [B01], in which the lowermost portion of the bottom of the first groove and the lowermost portion of the bottom of the third groove are located at a position closer to the first light emitting element than the third light emitting element, and the lowermost portion of the bottom of the second groove is located at a position closer to the second light emitting element than the third light emitting element.

REFERENCE SIGNS LIST

10R First light emitting element (red light emitting element)
10G Second light emitting element (green light emitting element)
10B Third light emitting element (blue light emitting element)
11 First substrate
12 Second substrate
13 Image display unit
14 Protective film
15 Resin layer (sealing resin layer)
CF, $CF_R$, $CF_G$, $CF_B$ color filter
BM Black matrix layer
20 Transistor
21 Gate electrode
22 Gate insulation layer
23 Channel formation region
24 Source/drain region
25 Element isolation region
30 Lowermost layer/interlayer insulation layer
31 First interlayer insulation layer
32 Second interlayer insulation layer
33 Uppermost layer/interlayer insulation layer
34 Interlayer insulation layer/laminated structure
35 Light reflecting layer
36R First light reflecting layer
36G Second light reflecting layer
36B Third light reflecting layer
37 Resist layer
$41_1$, $41_2$, $41_3$ Recess
$42_1$, $42_2$, $42_3$ Groove
$43_1$, $43_2$, $43_3$ Bottom of groove
44 Light shielding layer
51 First electrode
52 Second electrode
53 Organic layer
60, 62 Insulation film
61 Opening

The invention claimed is:

1. A method for manufacturing a display device including a plurality of pixels arranged in a two-dimensional matrix and respectively including a first light emitting element, a second light emitting element, and a third light emitting element matrix, each of the pixels including a lowermost layer/interlayer insulation layer, a first interlayer insulation layer formed on the lowermost layer/interlayer insulation layer, a second interlayer insulation layer formed on the first interlayer insulation layer, and an uppermost layer/interlayer insulation layer, each of the light emitting elements including:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode and including a light emitting layer containing an organic light emitting material; and a second electrode formed on the organic layer, the first light emitting element including a first light reflecting layer formed on the lowermost layer/interlayer insulation layer, the second light emitting element including a second light reflecting layer formed on the first interlayer insulation layer, and the third light emitting element including a third light reflecting layer formed on the second interlayer insulation layer, the method comprising:

(A) forming a lowermost layer/interlayer insulation layer, a patterned first interlayer insulation layer, and a patterned second interlayer insulation layer; then (B) forming a light reflecting layer on an entire upper surface of the structure resulting from step (A) and then patterning the light reflecting layer to form a first light reflecting layer on a region of the lowermost layer/interlayer insulation layer where a first light emitting element is to be formed, to form a second light reflecting layer on a region of the first interlayer insulation layer where a second light emitting element is to be formed, and to form a third light reflecting layer on a region of the second interlayer insulation layer where a third light emitting element is to be formed; then (C) etching at least a portion of the first interlayer insulation layer located in a boundary region between the first light emitting element and the second light emitting element to form a first recess, at the same time etching at least a portion of the second interlayer insulation layer located in a boundary region between the second light emitting element and the third light emitting element to form a second recess, and at the same time etching at least a portion of the first interlayer insulation layer and a portion of the second interlayer insulation layer located in a boundary region between the first light emitting element and the third light emitting element to form a third recess; then (D) forming an uppermost layer/interlayer insulation layer on an entire upper surface of the structure resulting from step (C) and then flattening the uppermost layer/interlayer insulation layer to form a first groove, a second groove, and a third groove in a portion of the uppermost layer/interlayer insulation layer above the first recess, the second recess, and the third recess, respectively; and then (E) forming a light shielding layer inside the first groove, the second groove, and the third groove.

2. The method for manufacturing a display device according to claim 1, wherein
in step (C),
a portion of the lowermost layer/interlayer insulation layer and a portion of the first interlayer insulation layer located in a boundary region between the first light emitting element and the second light emitting element are etched to form a first recess, at the same time
a portion of the first interlayer insulation layer and a portion of the second interlayer insulation layer located in a boundary region between the second light emitting element and the third light emitting element are etched to form a second recess, and at the same time
a portion of the lowermost layer/interlayer insulation layer, a portion of the first interlayer insulation layer, and a portion of the second interlayer insulation layer located in a boundary region between the first light emitting element and the third light emitting element are etched to form a third recess.

3. The method for manufacturing a display device according to claim 1, wherein
a lowermost portion of a bottom of the first groove and a lowermost portion of a bottom of the third groove are located at a position higher than a top surface of the first light reflecting layer, and
a lowermost portion of a bottom of the second groove is located at a position higher than a top surface of the second light reflecting layer.

4. The method for manufacturing a display device according to claim 3, wherein
the lowermost portion of the bottom of the first groove and the lowermost portion of the bottom of the third groove are located at a position closer to the first light emitting element than the third light emitting element, and
the lowermost portion of the bottom of the second groove is located at a position closer to the second light emitting element than the third light emitting element.

5. A display device comprising:
a plurality of pixels arranged in a two-dimensional matrix and respectively including a first light emitting element, a second light emitting element, and a third light emitting element, wherein
each of the pixels includes a lowermost layer/interlayer insulation layer, a first interlayer insulation layer formed on the lowermost layer/interlayer insulation layer, a second interlayer insulation layer formed on the first interlayer insulation layer, and an uppermost layer/interlayer insulation layer,
each of the light emitting elements includes:
a first electrode formed on the uppermost layer/interlayer insulation layer;
an insulation film formed at least on a region of the uppermost layer/interlayer insulation layer where the first electrode is not formed;
an organic layer formed over the insulation film from above the first electrode and including a light emitting layer containing an organic light emitting material; and
a second electrode formed on the organic layer,
the first light emitting element includes a first light reflecting layer formed on the lowermost layer/interlayer insulation layer,
the second light emitting element includes a second light reflecting layer formed on the first interlayer insulation layer,
the third light emitting element includes a third light reflecting layer formed on the second interlayer insulation layer,
the uppermost layer/interlayer insulation layer covers the lowermost layer/interlayer insulation layer, the first light reflecting layer, the second light reflecting layer, and the third light reflecting layer,
a first groove is formed in a portion of the uppermost layer/interlayer insulation layer located in a boundary region between the first light emitting element and the second light emitting element,
a second groove is formed in a portion of the uppermost layer/interlayer insulation layer located in a boundary region between the second light emitting element and the third light emitting element,
a third groove is formed in a portion of the uppermost layer/interlayer insulation layer located in a boundary region between the first light emitting element and the third light emitting element,
a light shielding layer is formed inside the first groove, the second groove, and the third groove,
a lowermost portion of a bottom of the first groove and a lowermost portion of a bottom of the third groove are located at a position higher than a top surface of the first light reflecting layer, and
a lowermost portion of a bottom of the second groove is located at a position higher than a top surface of the second light reflecting layer.

6. The display device according to claim 5, wherein
the lowermost portion of the bottom of the first groove and the lowermost portion of the bottom of the third groove are located at a position closer to the first light emitting element than the third light emitting element, and
the lowermost portion of the bottom of the second groove is located at a position closer to the second light emitting element than the third light emitting element.

* * * * *